(12) United States Patent
Chien et al.

(10) Patent No.: US 8,497,198 B2
(45) Date of Patent: Jul. 30, 2013

(54) SEMICONDUCTOR PROCESS

(75) Inventors: Chin-Cheng Chien, Tainan (TW);
Chun-Yuan Wu, Yunlin County (TW);
Chih-Chien Liu, Taipei (TW); Chin-Fu Lin, Tainan (TW); Teng-Chun Tsai, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 129 days.

(21) Appl. No.: 13/243,485

(22) Filed: Sep. 23, 2011

(65) Prior Publication Data

US 2013/0078778 A1    Mar. 28, 2013

(51) Int. Cl.
*H01L 21/4763* (2006.01)
*H01L 21/3205* (2006.01)
*H01L 21/336* (2006.01)

(52) U.S. Cl.
USPC ............ 438/587; 438/585; 438/595; 438/197

(58) Field of Classification Search
USPC .................................. 438/197, 585, 587, 595
See application file for complete search history.

(56) References Cited

U.S. PATENT DOCUMENTS

| | | | | |
|---|---|---|---|---|
| 6,043,138 | A | 3/2000 | Ibok | 438/493 |
| 6,492,216 | B1 | 12/2002 | Yeo et al. | 438/197 |
| 6,855,607 | B2 * | 2/2005 | Achuthan et al. | 438/283 |
| 6,879,001 | B2 * | 4/2005 | Yagishita et al. | 257/347 |
| 6,921,963 | B2 | 7/2005 | Krivokapic et al. | 257/618 |
| 7,013,446 | B2 | 3/2006 | Ohba et al. | 716/122 |
| 7,087,477 | B2 | 8/2006 | Fried et al. | 438/199 |
| 7,091,551 | B1 | 8/2006 | Anderson et al. | 257/324 |
| 7,112,495 | B2 | 9/2006 | Ko et al. | 438/300 |
| 7,129,550 | B2 * | 10/2006 | Fujiwara et al. | 257/401 |
| 7,247,887 | B2 | 7/2007 | King et al. | 257/139 |
| 7,250,658 | B2 | 7/2007 | Doris et al. | 257/350 |
| 7,309,626 | B2 | 12/2007 | Ieong et al. | 438/157 |
| 7,314,787 | B2 * | 1/2008 | Yagishita | 438/197 |
| 7,352,034 | B2 | 4/2008 | Booth, Jr. et al. | 257/369 |
| 7,470,570 | B2 | 12/2008 | Beintner et al. | 438/149 |
| 7,521,324 | B2 | 4/2009 | Ohmi et al. | 438/287 |
| 7,531,437 | B2 | 5/2009 | Brask et al. | 438/585 |
| 7,569,857 | B2 | 8/2009 | Simon et al. | 257/69 |
| 7,592,270 | B2 | 9/2009 | Teo et al. | 438/778 |

(Continued)

OTHER PUBLICATIONS

H. Kawasaki et al., "Challenges and Solutions of FinFET Integration in an SRAM Cell and a Logic Circuit for 22 nm node and beyond" Electron Devices Meeting (IEDM), 2009 IEEE International, pp. 1-4.

(Continued)

*Primary Examiner* — Luan C Thai
(74) *Attorney, Agent, or Firm* — J.C. Patents (57) ABSTRACT

A semiconductor process is described as follows. A plurality of dummy patterns is formed on a substrate. A mask material layer is conformally formed on the substrate, so as to cover the dummy patterns. The mask material layer has an etching rate different from that of the dummy patterns. A portion of the mask material layer is removed, so as to form a mask layer on respective sidewalls of each dummy pattern. An upper surface of the mask layer and an upper surface of each dummy pattern are substantially coplanar. The dummy patterns are removed. A portion of the substrate is removed using the mask layer as a mask, so as to form a plurality of fin structures and a plurality of trenches alternately arranged in the substrate. The mask layer is removed.

18 Claims, 11 Drawing Sheets

U.S. PATENT DOCUMENTS

| | | | |
|---|---|---|---|
| 2004/0195624 A1 | 10/2004 | Liu et al. | 257/347 |
| 2004/0222477 A1* | 11/2004 | Aller et al. | 257/412 |
| 2004/0256647 A1* | 12/2004 | Lee et al. | 257/289 |
| 2005/0051825 A1 | 3/2005 | Fujiwara et al. | 257/308 |
| 2006/0099830 A1 | 5/2006 | Walther et al. | 438/790 |
| 2006/0286729 A1 | 12/2006 | Kavalieros et al. | 438/183 |
| 2007/0015365 A1 | 1/2007 | Chen et al. | 438/692 |
| 2007/0072376 A1 | 3/2007 | Chen et al. | 438/275 |
| 2007/0108528 A1 | 5/2007 | Anderson et al. | 257/365 |
| 2007/0158756 A1 | 7/2007 | Dreeskornfeld et al. | 257/374 |
| 2007/0218661 A1 | 9/2007 | Shroff et al. | 438/510 |
| 2008/0061366 A1 | 3/2008 | Liu et al. | 257/336 |
| 2008/0157208 A1 | 7/2008 | Fischer et al. | 257/368 |
| 2009/0057759 A1 | 3/2009 | Obradovic et al. | 257/338 |
| 2009/0124097 A1 | 5/2009 | Cheng | 438/792 |
| 2009/0200494 A1 | 8/2009 | Hatem et al. | 250/492.21 |
| 2009/0242964 A1 | 10/2009 | Akil et al. | 257/324 |
| 2009/0269916 A1 | 10/2009 | Kang et al. | 438/587 |
| 2010/0044783 A1 | 2/2010 | Chuang et al. | 257/328 |
| 2010/0048027 A1 | 2/2010 | Cheng et al. | 438/745 |
| 2010/0072553 A1 | 3/2010 | Xu et al. | 257/369 |
| 2010/0129994 A1 | 5/2010 | Awad et al. | 438/483 |
| 2010/0144121 A1 | 6/2010 | Chang et al. | 438/478 |
| 2010/0167506 A1 | 7/2010 | Lin et al. | 438/513 |
| 2011/0237046 A1* | 9/2011 | Maszara et al. | 438/424 |

OTHER PUBLICATIONS

H. Kawasaki et al., "FinFET Process and Integration Technology for High Performance LSI in 22 nm node and beyond" Ext. Abs the $7^{th}$ International Workshop on Junction Technology 2007, pp. 3-8.

M. Jurczak et al., "Review of FinFET Technology" SOI Conference, 2009 IEEE International, pp. 1-4.

* cited by examiner

SEMICONDUCTOR PROCESS

BACKGROUND OF THE INVENTION

1. Field of Invention

The present invention relates to a semiconductor process, and more generally to a method of forming a fin-type field effect transistor (FinFET).

2. Description of Related Art

Along with rapid progress in semiconductor technology, dimensions of integrated circuits (IC) are reduced and the degree of integration thereof is increased continuously to further enhance the speed and performance of the device. Generally speaking, with the design trend of scaling down the device size, a channel length of a transistor is accordingly shortened to facilitate the operation speed of the device. However, such design would cause the transistor to have problems such as serious leakage current, short channel effect, 'on' current decrease, etc.

In recent years, a multigate structure is proposed to overcome the above-mentioned problems. A gate in the multigate structure surrounds the channel region, so that the entire channel region is subjected to the influence of the gate electric field. Ultimately, the 'on' current of the device is increased and the leakage current is reduced.

SUMMARY OF THE INVENTION

The present invention provides a semiconductor process not only to decrease the pattern line width but also to ensure accurate pattern transfer.

The present invention provides a semiconductor process including the following steps. A plurality of dummy patterns is formed on a substrate. A mask material layer is conformally formed on the substrate to cover the dummy patterns, wherein an etching rate of the mask material layer is different from that of the dummy patterns. A portion of the mask material layer is removed, so as to form a mask layer on sidewalls of each dummy pattern, wherein an upper surface of the mask layer is substantially coplanar with upper surfaces of the dummy patterns. The dummy patterns are removed. A portion of the substrate is removed by using the mask layer as a mask, so as to form a plurality of fin structures and a plurality of trenches alternately arranged in the substrate. The mask layer is removed.

According to an embodiment of the present invention, the method of forming the mask layer includes performing a modification treatment to a surface of the mask material layer substantially parallel to a horizontal plane so that the mask material layer has a modified part and an unmodified part; and removing the modified part.

According to an embodiment of the present invention, the modification treatment includes a vertical ion implantation process. The vertical ion implantation process implants carbon ions into the modified part.

According to an embodiment of the present invention, the method of forming the mask layer includes the following steps. A photoresist layer is formed on the mask material layer between two adjacent dummy patterns, so as to at least expose a portion of the mask material layer on the dummy patterns. A portion of the mask material layer is removed by using the photoresist layer as a mask, so as to expose top surfaces of the dummy patterns. A modification treatment is performed to an exposed surface of the mask material layer by using the photoresist layer as a mask, so that the mask material layer has a modified part and an unmodified part, wherein an etching rate of the modified part is different from that of the unmodified part. The photoresist layer and a portion of the unmodified part therebelow are removed by using the modified part as a mask.

According to an embodiment of the present invention, the modification treatment includes an oxidation treatment, such as an oxygen plasma process or an oxygen ion implantation process.

According to an embodiment of the present invention, the semiconductor process further includes forming a plurality of hard mask layers respectively on the dummy patterns before the step of forming the mask material layer, so that the mask material layer covers the hard mask layers.

According to an embodiment of the present invention, the method of forming the mask layer includes the following steps. A dielectric layer is formed on the mask material layer between two adjacent dummy patterns, wherein a top surface of the dielectric layer is substantially as high as that of the mask material layer on the dummy patterns. A portion of the mask material layer on the dummy patterns and a portion of the dielectric layer are removed, so as to expose top surfaces of the dummy patterns. A modification treatment is performed to an exposed surface of the mask material layer by using the remaining dielectric layer as a mask, so that the mask material layer has a modified part and an unmodified part, wherein an etching rate of the modified part is different from that of the unmodified part. The dielectric layer and a portion of the unmodified part therebelow are removed by using the modified part as a mask.

According to an embodiment of the present invention, the modification treatment includes an oxidation treatment, such as an oxygen plasma process or an oxygen ion implantation process.

According to an embodiment of the present invention, the semiconductor process further includes forming a plurality of hard mask layers respectively on the dummy patterns before the step of forming the mask material layer, so that the mask material layer covers the hard mask layers.

According to an embodiment of the present invention, the substrate is a bulk substrate. The semiconductor process further includes forming a plurality of isolation structures in the trenches respectively, wherein top surfaces of the isolation structures are lower than those of the fin structures.

According to an embodiment of the present invention, the substrate includes a bottom layer, an insulating layer and a bulk layer, and the insulating layer is disposed between the bottom layer and the bulk layer. The method of forming the fin structures includes removing a portion of the bulk layer by using the mask layer as a mask, so as to expose a portion of the insulating layer.

According to an embodiment of the present invention, the semiconductor process further includes forming a gate on the substrate to cover the fin structures.

According to an embodiment of the present invention, the semiconductor process further includes forming a source and a drain on respective ends of each fin structure.

In view of the above, in the semiconductor process of the invention, the mask layer is formed on the sidewalls of the dummy patterns. The pattern line width of the mask layer can thus be decreased by controlling the deposition thickness of the mask material layer. Further, the top surface of the mask layer on the sidewalls of the dummy patterns is coplanar with the top surfaces of the dummy patterns. That is, the formed mask layer has a good pattern profile, so as to ensure a precise pattern of the fin structures transferred from the mask layer.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

A FinFET structure can be fabricated by the semiconductor process of the present invention. In a FinFET structure, one or multiple fin structures are extended between a source and a drain of the transistor, and a gate is formed across the fin structures. Moreover, the contact surface region between each fin structure and the gate determines an effective channel of the FinFET.

For example, in a tri-gate structure, the effective channel of the FinFET is disposed not only on the top surface portions but also on the sidewall portions of the fin structures, so as to greatly increase the channel width. Generally speaking, a drive current of the transistor is proportional to the channel width, so that such disposition can enhance the drive current of the FinFET. Accordingly, as compared with the planar transistor, the FinFET has an increased channel width, and thus, a higher drive current can be obtained with a less chip region in an integrated circuit.

Embodiments of the present invention are illustrated one by one with their cross-sectional views in the following. It is noted that the process flow (as described below) is for illustrating how the semiconductor process of the present invention is applied to form fin structures of the FinFET, and thereby enables those having ordinary skill in the art to practice this invention, but is not intended to limit the scope of this invention. Other components included in the transistor, and arrangements and forming methods thereof are well-known to those having ordinary skill in the art, and thus the detailed are not iterated.

First Embodiment

FIGS. 1A to 1F schematically illustrate cross-sectional views of a semiconductor process according to a first embodiment of the present invention. FIG. 1G schematically illustrates a top view of the structure layout of FIG. 1F, wherein only main components of fin structures, a gate, sources and drains are shown to simply the figure.

Figure 1A:
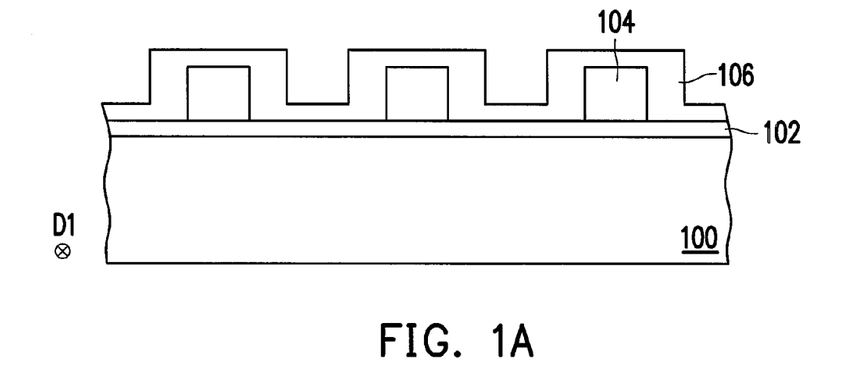
FIGS. 1A to 1F schematically illustrate cross-sectional views of a semiconductor process according to a first embodiment of the present invention.

Referring to FIG. 1A, a substrate 100 such as a bulk wafer is provided. It is noted that in FIG. 1A, a bulk wafer is provided for illustration purposes, but the present invention is not limited thereto. In another embodiment, the substrate 100 can be a silicon on insulator (SOI) wafer. The material of the substrate 100 is selected from the group consisting of silicon (Si), germanium-doped silicon (Ge-doped Si), carbon-doped silicon (C-doped Si), SiGe, germanium (Ge), and III-V semiconductor such as GaAs, InGaAs, InSb, InAs, GaSb, InP, etc. Thereafter, a pad layer 102 is optionally formed on the substrate 100, so as to improve adhesion of dummy patterns 104 to be formed onto the substrate 100. The material of the pad layer 102 is silicon oxide, and the forming method includes performing a thermal oxidation process or a chemical vapour deposition (CVD) process, for example.

Afterwards, a plurality of dummy patterns 104 is formed on the pad layer 102. The dummy patterns 104 are stripe patterns arranged in parallel and extending along a direction D1 perpendicular to the drawings. The material of the dummy patterns 104 is selected from undoped or doped polysilicon, silicon oxide, silicon nitride, silicon oxynitride, silicon carbide, SiCN, BN, low K materials, ultra low K (ULK) materials, carbon-containing materials, etc. The method of forming the dummy patterns 104 includes forming a layer made of the foregoing material on the pad layer 102, and patterning the material layer by using a patterned photoresist layer as a mask with lithography and etching processes.

A mask material layer 106 is then conformally formed on the substrate 100 to cover the dummy patterns 104, the pad layer 102 and the substrate 100. The material of the mask material layer 106 is selected from undoped or doped polysilicon, silicon oxide, silicon nitride, silicon oxynitridem silicon carbide, SiCN, BN, low K materials, ultra low K (ULK) materials, carbon-containing materials, etc. It is noted that the mask material layer 106 has an etching rate different from that of the dummy patterns 104. That is, an etching process has a high etching selectivity ratio of the mask material layer 106 to the dummy patterns 104a. For example, when the material of the dummy patterns 104 is polysilicon, a silicon nitride layer formed by atomic layer deposition (ALD) is chosen as the mask material layer 106. However, the present invention is not limited thereto.

Figure 1B:
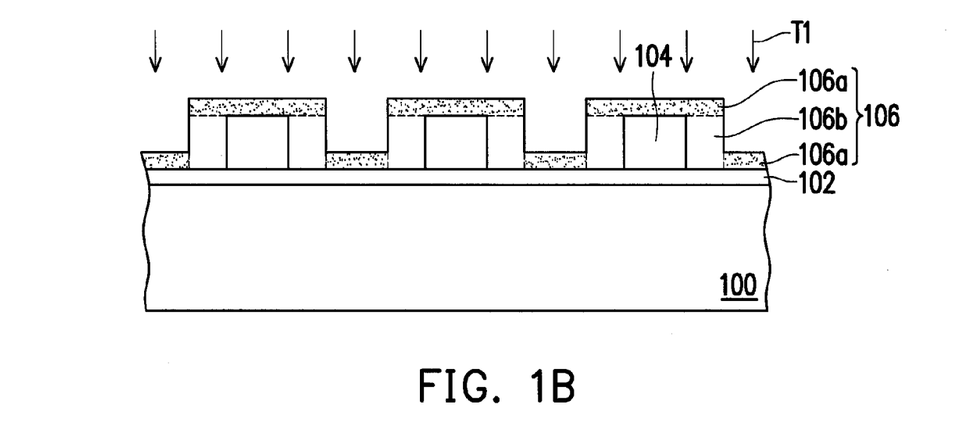

Referring to FIG. 1B, a modification treatment T1 is performed to a surface of the mask material layer 106 parallel to the horizontal plane, so that the mask material layer 106 has a modified part 106a and an unmodified part 106b. The modification treatment T1 can be an ion implantation process, in which the implant ions are carbon ions, for example. Further, the ion implantation process is, for example, a vertical implantation with a tilted angle of about 0°, and enables at least a portion of the mask material layer 106 on the dummy patterns 104 to be modified with the process.

Figure 1C:
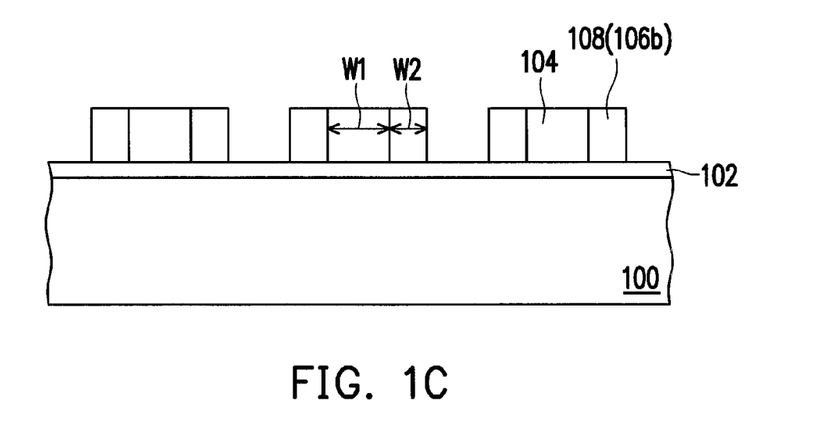

Referring to FIG. 1C, the modified part 106a of the mask material layer 106 is removed, and the remaining unmodified part 106b forms a mask layer 108. The mask layer 108, in a form of stripes, forms on both sidewalls of each dummy pattern 104 and exposes the top surface of each dummy pattern 104. In an embodiment, the top surface of the mask layer 108 is substantially coplanar with the top surfaces of the dummy patterns 104. The method of removing the modified part 106a includes performing an anisotropic dry etching process.

It is noted that when the modification treatment T1 is performed to the mask material layer 106 with the ion implantation process, the vertical implant ions would bombard the upper portion of the mask material layer 106 substantially parallel to the horizontal plane and make the upper portion have a loose structure. Accordingly, when the dry etching is performed, the modified part 106a being ion bombarded or being implanted with carbon ions has a higher removing rate than the unmodified part 106b without ion bombardment. Therefore, during the dry etching process, almost only the modified part 106a is removed to retain the mask layer 108 (i.e. unmodified part 106b) on both sidewalls of each dummy pattern 104.

Figure 1D:
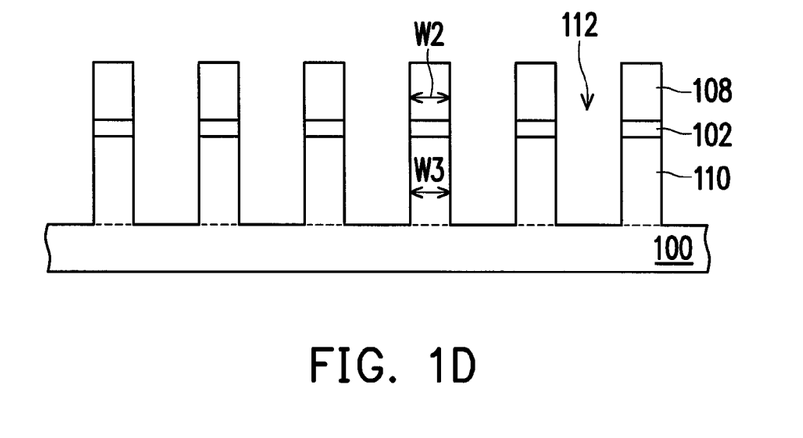

Referring to FIG. 1D, the dummy patterns 104 are removed to merely retain the mask layer 108 on the pad layer 102. The method of removing the dummy patterns 104 includes performing a wet etching process with an etchant including diluted hydrofluoric acid (DHF), ammonia or tetra methyl ammonium hydroxide (TMAH), etc. Thereafter, the exposed pad layer 102 and a portion of the substrate 100 are removed by using the mask layer 108 as a mask, so as to form a plurality of fin structures 110 and a plurality of trenches 112 arranged alternately in the substrate 100. In this embodiment, the fin structures 110 and the trenches 112 are arranged in parallel and extend along the direction D1 perpendicular to the drawings. The method of removing the pad layer 102 and the portion of the substrate 100 not covered by the mask layer 108 includes performing an anisotropic dry etching process.

Figure 1E:
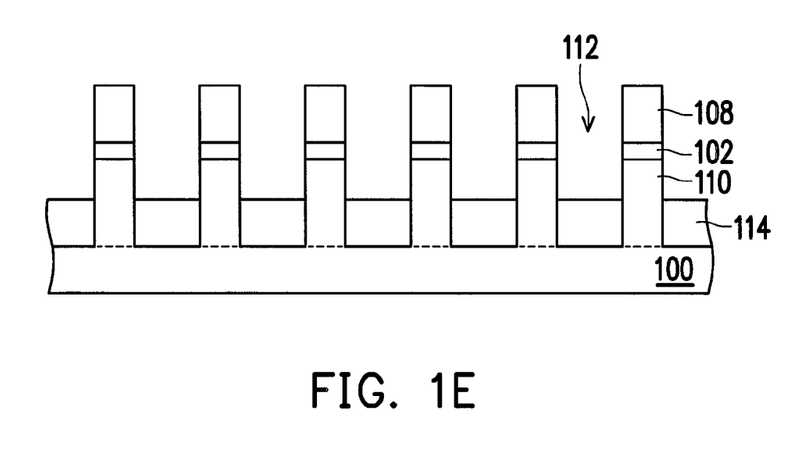

Referring to FIG. 1E, isolation structures 114 are formed in the trenches 112, and top surfaces of the isolation structures 114 are lower than those of the fin structures 110. The material of the isolation structures 114 can be silicon oxide. In an embodiment, the method of forming the isolation structures 114 includes forming a silicon oxide layer to cover the mask layer 108 and fill up the trenches 112 with chemical vapour deposition, and then removing a portion of the silicon oxide layer until upper sidewalls of the fin structures 110 are exposed. The step of removing the portion of the silicon oxide layer includes performing a chemical mechanical polishing (CMP) process and a dry etching back process in sequence.

Figure 1F:
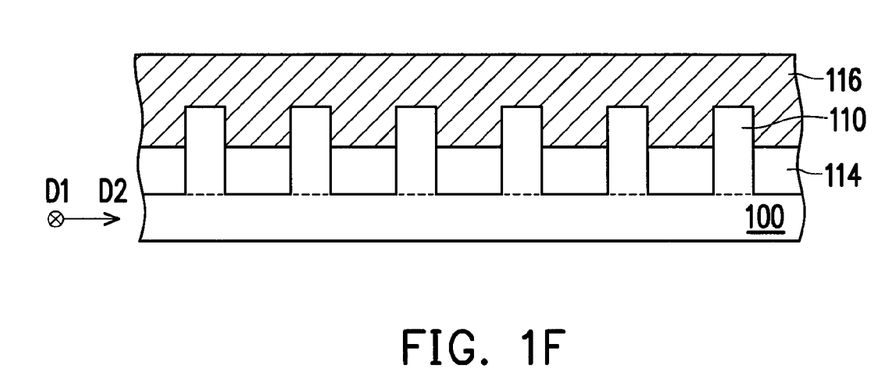
Figure 1G:
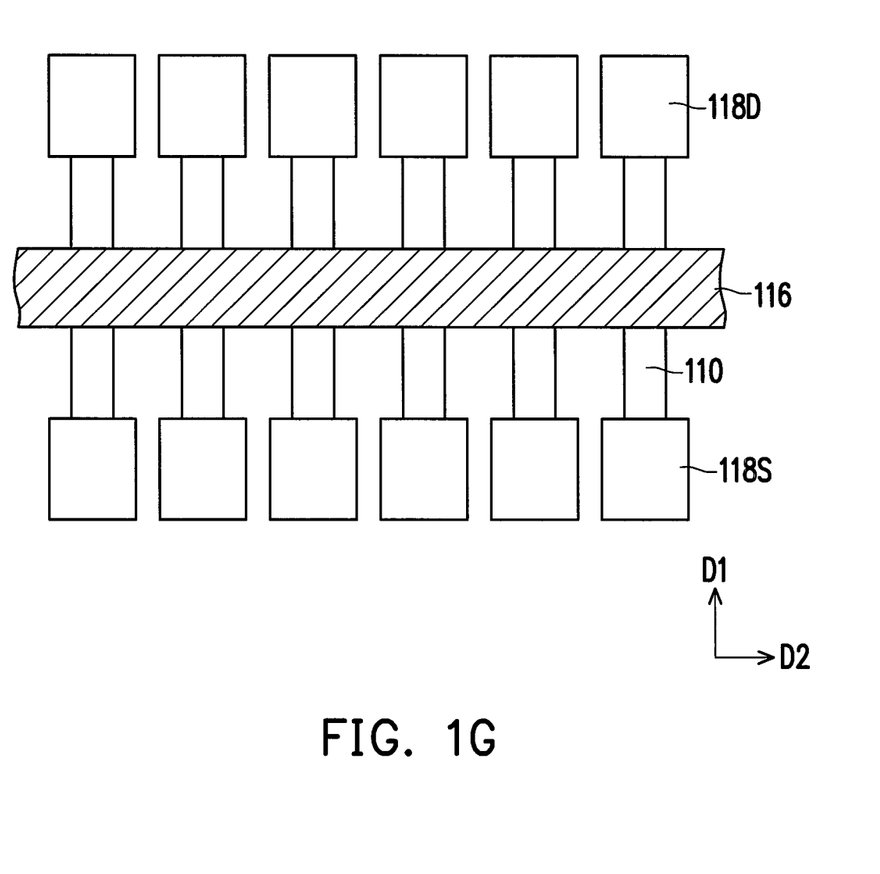
FIG. 1G schematically illustrates a top view of the structure layout of FIG. 1F.

Referring to FIGS. 1F and 1G, the mask layer 108 and the pad layer 102 are removed to expose the top surfaces of the fin structures 110. Thereafter, a gate 116 is formed on the substrate 100. The gate 116 has a stripe pattern extending along a direction D2, and covers a portion of the fin structures 110 and a portion of the isolation structures 114. In this embodiment, the extending direction D2 of the gate 116 is different from the extending direction D1 of the fin structures 110. For example, the direction D2 is perpendicular to the direction D1. The material of the gate 116 includes polysilicon, metal, alloy, metal silicide or a combination thereof. In addition, a gate dielectric layer (not shown) may be further formed between the gate 116 and the fin structures 110, wherein the gate dielectric layer can be arranged or formed based on requirements of the practical manufacture. Afterwards, a source 118S and a drain 118D are respectively formed on two ends of each fin structure 110. Thus, the FinFET structure is approximately completed. In an embodiment, to further increase the channel width of the FinFET, two ends of each Fin structure 110 are connected to the same source and the same drain.

The mask layer 108 (i.e. unmodified part 106b of the mask material layer 106) is formed on both sidewalls of each dummy pattern 104. It is mentioned that the pattern line width of the mask layer 108 can be determined by controlling the deposition thickness of the mask material layer 106. In other words, by controlling the deposition conditions of the mask material layer 106 to reduce the thickness thereof, the mask layer 108 with a narrower pattern line width can be obtained, and the line width of the fin structures 110 defined by the mask layer 108 is according decreased. For example, as shown in FIGS. 1C and 1D, when the resolution limit of the lithography process is 30 nm, the pattern line width W1 of each dummy pattern 104 is about 30 nm. Herein, by controlling the deposition thickness of the mask material layer 106 to be about 20 nm, the formed mask layer 108 on the sidewalls of the dummy patterns 104 can have a pattern line width W2 of about 20 nm. That is, the mask layer 108 is obtained with the pattern line width less than the optical limit. Accordingly, the fin structures 110 defined by the mask layer 108 (as a mask) can have a pattern line width W3 of about 20 nm to further enhance the degree of integration of the device.

It is noted that even if an anisotropic etching process is performed to a material layer, slight isotropic etching may occur to damage the material layer, so as to affect the profile of the remaining material layer. Therefore, in the case that the anisotropic etching process is directly performed to the mask material layer 106 without a modification treatment, the remaining mask material layer easily forms spacer structures with rounding tops on the sidewalls of the dummy patterns 104. The fin structures are subsequently defined by these spacer structures with varied pattern line widths, so that the pattern line width of the formed fin structures varies to affect the process window. However, in this embodiment, the mask layer 108 for defining the fin structures 110 is formed by performing the modification treatment T1 to the upper portion of the mask material layer 106 and followed by removing the modified part 106a, so that the top portion of the mask layer 108 has an improved pattern profile and does not form the rounding corner as described in the said spacer structures. Therefore, the mask layer 108 of this embodiment can perform a precise pattern transfer to the fin structures 110.

Second Embodiment

Figure 2A:
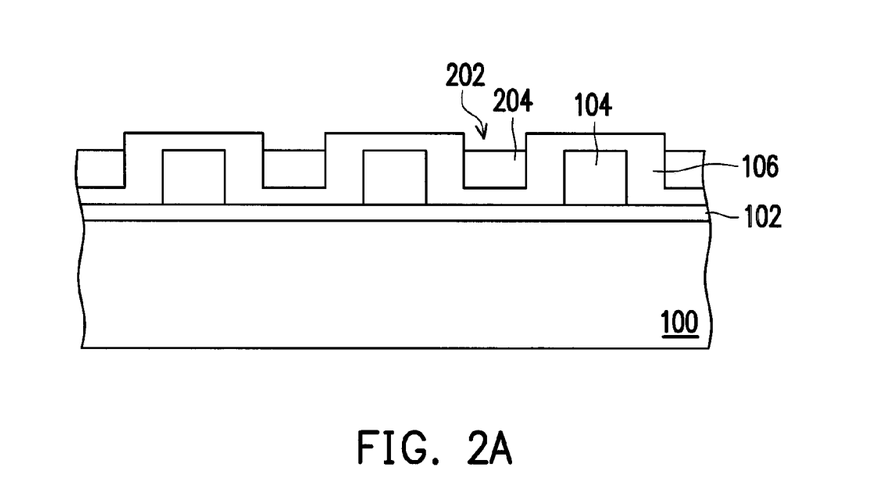
FIGS. 2A to 2D schematically illustrate cross-sectional views of a semiconductor process according to a second embodiment of the present invention.

FIGS. 2A to 2D schematically illustrate cross-sectional views of a semiconductor process according to a second embodiment of the present invention. FIG. 2A describes the step after FIG. 1A of the first embodiment. The same reference numbers denote the same components and the details are not iterated herein.

Referring to FIG. 2A, after the mask material layer 106 is conformally formed on the substrate 100, recesses 202 are formed in the mask material layer 106 between adjacent dummy patterns 104. Thereafter, a photoresist layer 204 is formed on the mask material layer 106 between two adjacent dummy patterns 104, so as to at least expose the mask material layer 106 on the dummy patterns 104. Specifically, the photoresist layer 204 fills in the recesses 202 of the mask material layer 106, and the top surface of the photoresist layer 204 is substantially as high as the top surfaces of the dummy patterns 104, so as to expose the surface of the mask material layer 106 substantially parallel to the horizontal plane. The method of forming the photoresist layer 204 includes coating a photoresist material on the mask material layer 106 to fill up the recesses 202, and then performing an etching back process to remove the photoresist material outside the recesses 202 and adjust the height position of the top surface of the photoresist layer 204.

Figure 2B:
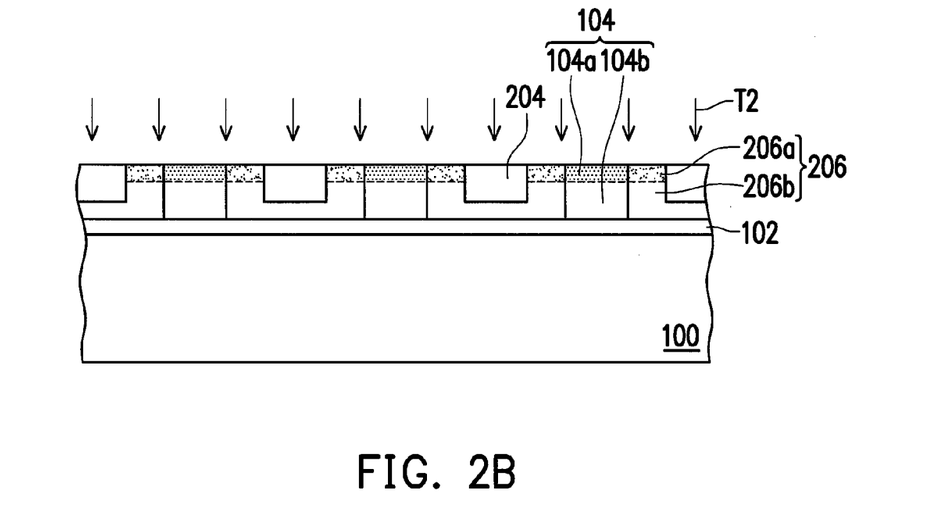

Referring to FIG. 2B, the exposed portion of the mask material layer 106 is removed by using the photoresist layer 204 as a mask. The remaining mask material layer 206 exposes the top surfaces of the dummy patterns 104. In an embodiment, the top surface of the remaining mask material layer 206 is substantially coplanar with the top surfaces of the dummy patterns 104. The method of removing the exposed portion of the mask material layer 106 includes performing a dry or wet etching process.

Thereafter, a modification treatment T2 is performed to the exposed surface of the mask material layer 206, so that the mask material layer 206 has a modified part 206a and an unmodified part 206b. It is noted that the modified part 206a of the mask material layer 206 has an etching rate different from that of the unmodified part 206b. During the step of performing the modification treatment T2 to the mask material layer 206, the dummy patterns 104 exposed by the photoresist layer 204 are also subject to the same modification treatment T2, so that each dummy pattern 104 has a modified part 104a and an unmodified part 104b.

The said modification treatment T2 can be an oxidation treatment, such as an oxygen plasma process or an oxygen ion implantation process. For example, when the material of the dummy patterns 104 is polysilicon and the material of the mask material layer 206 is silicon nitride, each modified part 104a is formed by silicon oxide and each modified part 206a is formed by silicon oxynitride. However, the present invention is not limited thereto. In an embodiment, the modification treatment T2 can be an oxidation treatment which uses oxygen-containing plasma. In another embodiment, the modification treatment T2 can be a vertical oxygen ion implantation process.

Figure 2C:
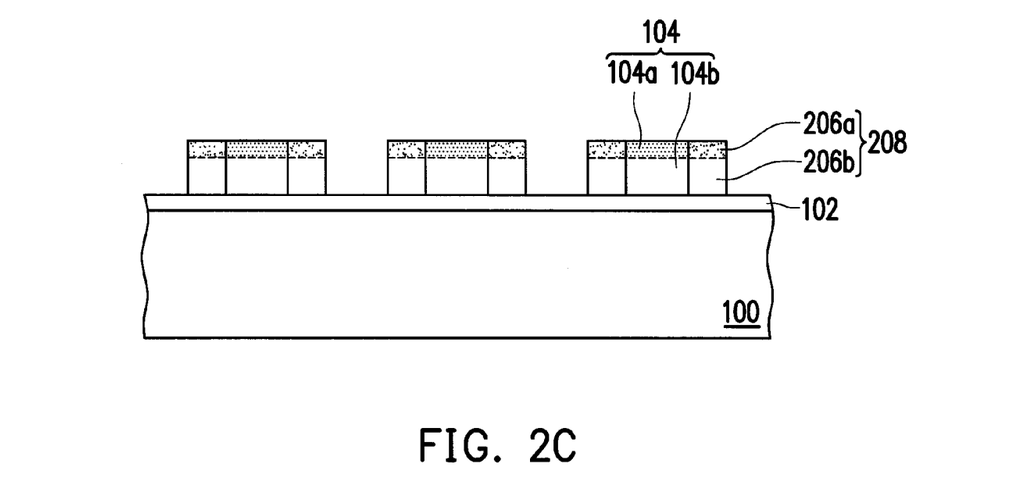

Referring to FIG. 2C, the photoresist layer 204 and a portion of the mask material layer 206 (i.e. unmodified part 206b) therebelow are removed. The modified part 206a and the remaining unmodified part 206b on both sidewalls of each dummy pattern 104 form a mask layer 208. The method of forming the mask layer 208 includes performing a dry etching process to the exposed mask material layer 206 by using the modified parts 104a and the modified part 206a as a mask, so as to remove the unmodified part 206b below the photoresist layer 204 to expose the pad layer 102.

Figure 2D:
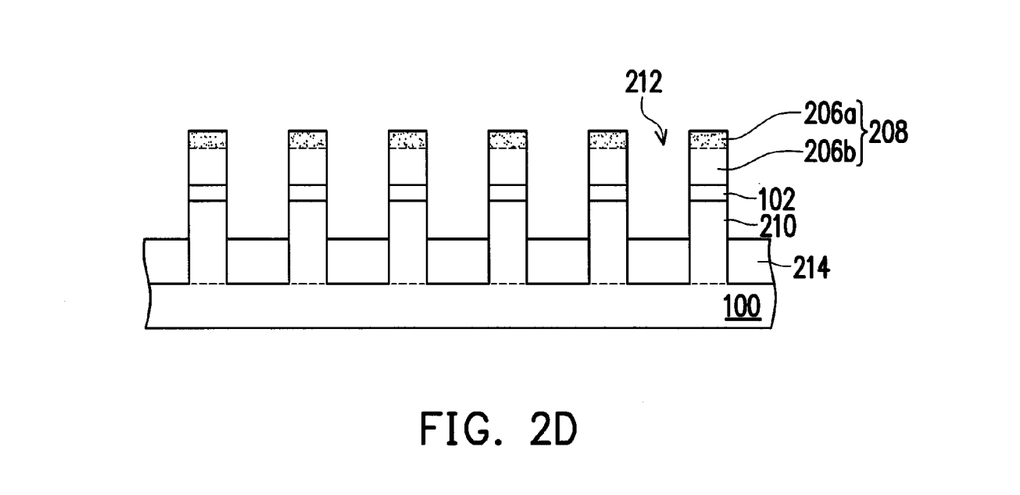

Referring to FIG. 2D, the dummy patterns 104 are removed to merely retain the mask layer 208 on the pad layer 102. The method of removing the dummy patterns 104 includes performing a wet etching process with an etchant including diluted hydrofluoric acid (DHF), ammonia or tetra methyl ammonium hydroxide (TMAH), etc. The modified parts 104a and the unmodified parts 104b of the dummy patterns 104 can be removed in the same step. Thereafter, the exposed pad layer 102 and a portion of the substrate 100 are removed by using the mask layer 208 as a mask, so as to form a plurality of fin structures 210 and a plurality of trenches 212 arranged alternately in the substrate 100. Afterwards, isolation structures 214 are formed in the trenches 212, and the top surfaces thereof are lower than those of the fin structures 210.

After the structure of FIG. 2D is completed, the mask layer 208 and the pad layer 102 on the fin structures 210 are removed, and a gate, sources and drains are formed, thereby obtaining the FnFET structure shown in FIGS. 1F and 1G. The applications and modifications of these steps should be apparent to those having ordinary skill in the art in accordance with the said embodiments, and thus, the detailed descriptions are not specifically described herein.

Third Embodiment

FIGS. 3A to 3D schematically illustrate cross-sectional views of a semiconductor process according to a third embodiment of the present invention. The process steps and sequence in FIGS. 3A to 3D are similar to those in FIGS. 2A to 2D. The same reference numbers denote the same components and the details are not iterated herein.

Figure 3A:
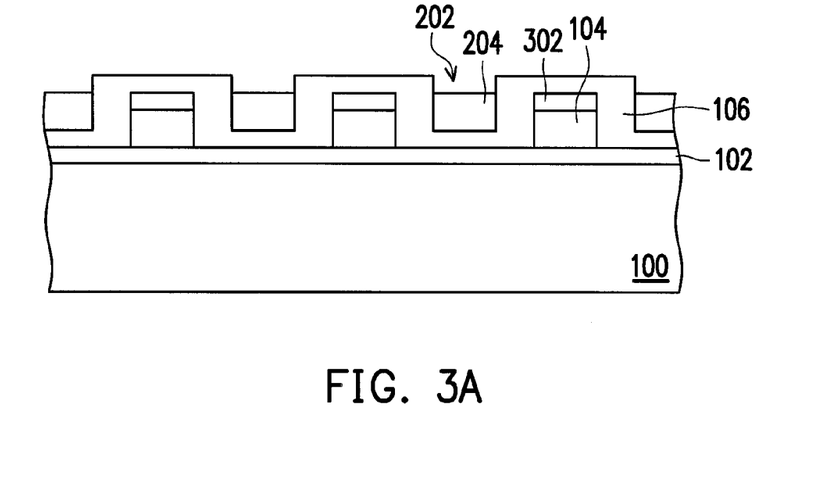
FIGS. 3A to 3D schematically illustrate cross-sectional views of a semiconductor process according to a third embodiment of the present invention.

Referring to FIG. 3A, the main difference between the second and third embodiments lies in that before the step of forming the mask material layer 106, a plurality of hard mask layers 302, in this embodiment, are respectively formed on the dummy patterns 104. Therefore, the subsequently formed mask material layer 106 can cover the hard mask layers 302, the pad layer 102 and the substrate 100. The material of the hard mask layers 302 is silicon nitride or silicon oxide, for example. The method of forming the dummy patterns 104 and the hard mask layers 302 includes sequentially depositing material layers for forming the dummy patterns 104 and the hard mask layers 302, and then patterning the material layers with lithography and etching processes. Thereafter, a photoresist layer 204 is formed on the mask material layer 106 between adjacent dummy patterns 104, so as to at least expose the mask material layer 106 on the dummy patterns 104.

Figure 3B:
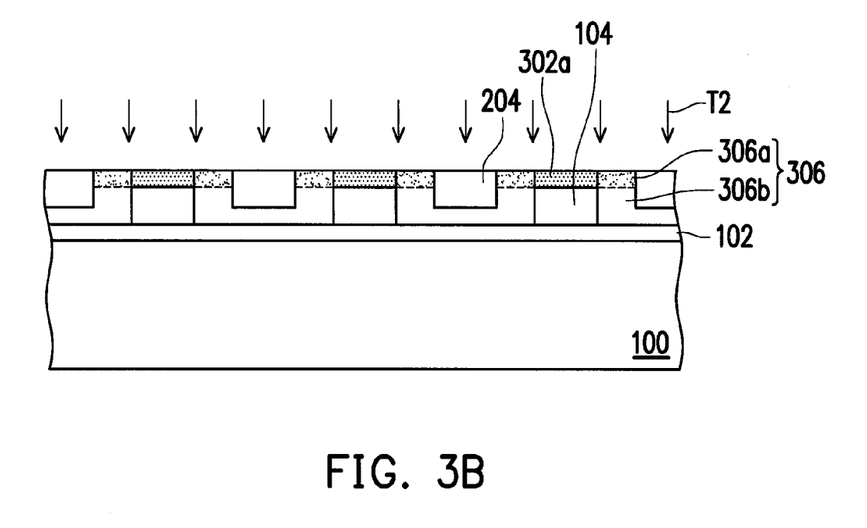

Referring to FIG. 3B, the exposed portion of the mask material layer 106 is removed by using the photoresist layer 204 as a mask, so that the remaining mask material layer 306 exposes the top surfaces of the hard mask layers 302. In an embodiment, the upper surface of the remaining mask material layer 306 is substantially coplanar with the upper surfaces of the hard mask layers 302.

Thereafter, a modification treatment T2 is performed to the exposed surface of the mask material layer 306 and the hard mask layers 302 by using the photoresist layer 204 as a mask. After the modification treatment T2, the mask material layer 306 has a modified part 306a and an unmodified part 306b. In an embodiment, when the material of the mask material layer 306 is silicon nitride, the modified part 306a is formed by silicon oxynitride, so that the modified part 306a has an etching rate different from that of the unmodified part 306b. Herein, when the material of the hard mask layers 302 is silicon nitride, the modified hard mask layers 302a are formed by silicon oxynitride; or when the material of the hard mask layers 302 is silicon oxide, the modified hard mask layers 302a are formed by silicon oxide.

Figure 3C:
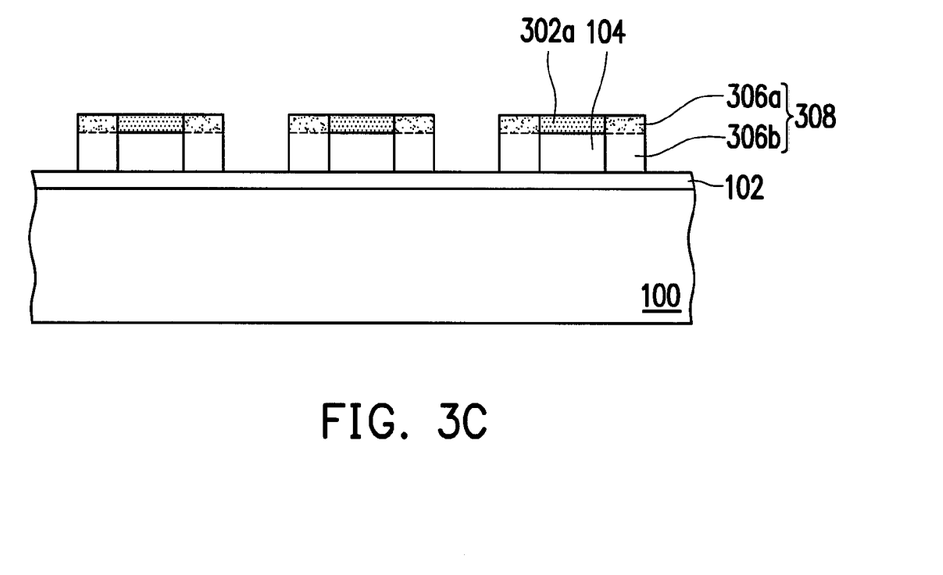

Referring to FIG. 3C, the photoresist layer 204 and a portion of the mask material layer 306 (i.e. the unmodified part 306b) therebelow are removed by using the modified part 206a and the modified hard mask layers 302a as a mask, so as to expose the pad layer 102. A mask layer 308 is formed consisting of the modified part 306a on the sidewalls of the modified hard mask layers 302a and the remaining unmodified part 306b on the sidewalls of the dummy patterns 104.

Figure 3D:
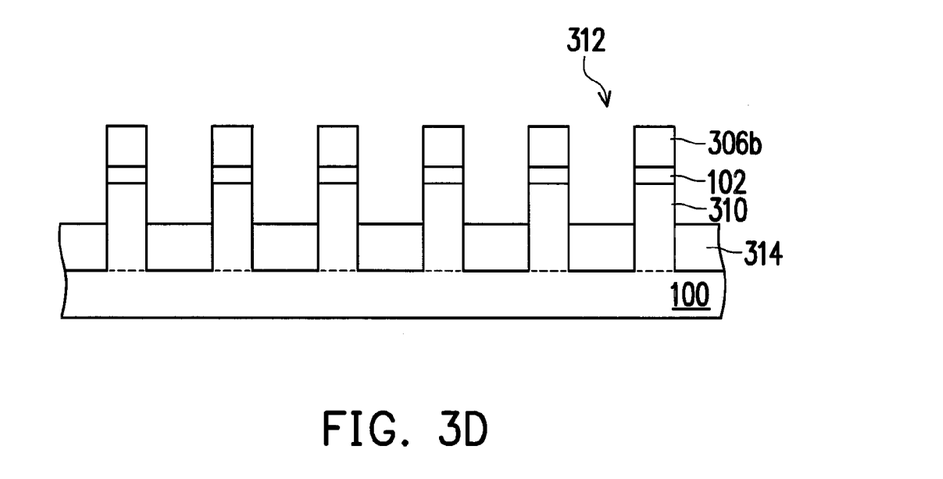

Referring to FIG. 3D, the modified hard mask layers 302a and the dummy patterns 104 are removed to merely retain the mask layer 308 on the pad layer 102. The method of removing the modified hard mask layers 302a and the dummy patterns 104 includes performing a wet etching process. The modified hard mask layers 302a and the dummy patterns 104 can be simultaneously removed in the same step. In an embodiment, the modified part 306a of the mask layer 308 and the modified hard mask layers 302a may have the similar etching rate, so that the modified part 306a can be simultaneously removed by the said wet etching step, and thus, only the unmodified part 306b remains on the pad layer 102.

Thereafter, the exposed pad layer 102 and a portion of the substrate 100 are removed by using the remaining unmodified part 306b as a mask, so as to form a plurality of fin structures 310 and a plurality of trenches 312 arranged alternately in the substrate 100. Afterwards, isolation structures 314 are formed in the trenches 312, and the top surfaces thereof are lower than those of the fin structures 310. Then, the remaining unmodified part 306b and the pad layer 102 on the fin structures 210 are removed by the described method, and a gate, sources and drains are formed, thereby obtaining the FnFET structure.

Fourth Embodiment

FIGS. 4A to 4D schematically illustrate cross-sectional views of a semiconductor process according to a fourth embodiment of the present invention. The process steps and sequence in FIGS. 4A to 4D are similar to those in FIGS. 2A to 2D. The same reference numbers denote the same components and the details are not iterated herein.

Figure 4A:
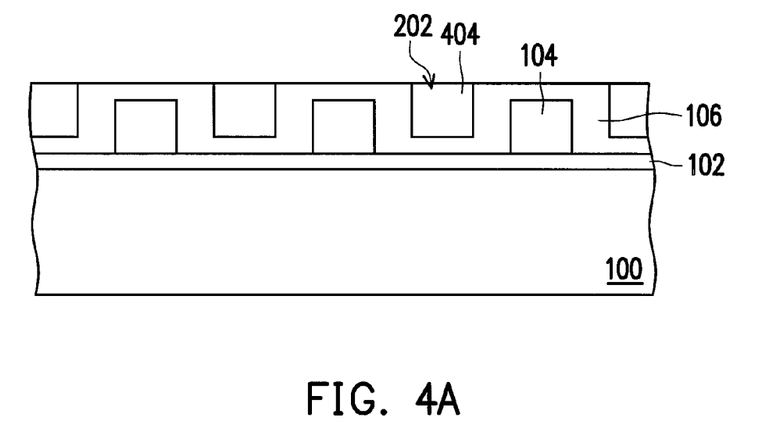
FIGS. 4A to 4D schematically illustrate cross-sectional views of a semiconductor process according to a fourth embodiment of the present invention.

Referring to FIG. 4A, the main difference between the second and fourth embodiments lies in that a dielectric layer 404, in this embodiment, replaces the photoresist layer 204 of FIG. 2A, and is formed on the mask material layer 106 between adjacent dummy patterns 104. Specifically, the dielectric layer 404 fills in the recesses 202 in the mask material layer 106, and the top surface thereof is substantially as high as that of the mask material layer 106 on the dummy patterns 104, so as to expose the top surface of the mask material layer 106. The material of the dielectric layer 404 is silicon oxide or a suitable material. The method of forming the dielectric layer 404 includes depositing a silicon oxide material on the mask material layer 106 to fill up the recesses 202, and then performing a CMP process to remove the silicon oxide material outside the recesses 202. During the step of performing the CMP process, the mask material layer 106 on the dummy patterns 104 serves as a polishing stop layer.

Figure 4B:
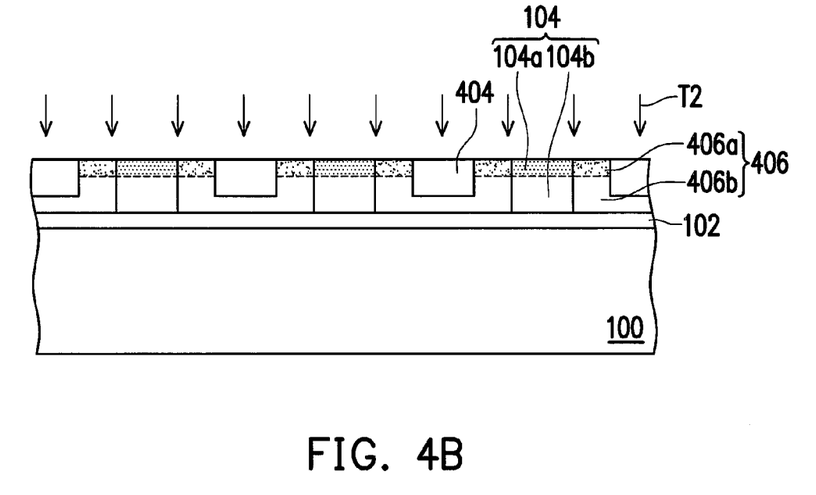

Referring to FIG. 4B, at least a portion of the mask material layer 106 on the dummy patterns 104 is removed, so that the remaining mask material layer 406 exposes the top surfaces of the dummy patterns 104. The method of removing the portion of the mask material layer 106 on the dummy patterns 104 includes performing a CMP process by using the dummy patterns 104 as a polishing stop layer. In an embodiment, during the step of removing the portion of the mask material layer 106 on the dummy patterns 104, a portion of the dielectric layer 404 is simultaneously removed, so that the top surfaces of the remaining mask material layer 406 and the remaining dielectric layer 404 are substantially coplanar with the top surfaces of the dummy patterns 104.

Thereafter, a modification treatment T2 is performed to the exposed mask material layer 306 and the dummy patterns 104 by using the remaining dielectric layer 404 as a mask. After the modification treatment T2, the mask material layer 406 has a modified part 406a and an unmodified part 406b, and each dummy pattern 104 has a modified part 104a and an unmodified part 104b. It is noted that when the material of the mask material layer 406 is silicon nitride, the modified part 406a is formed by silicon oxynitride, so that the modified part 406a has an etching rate different from that of the unmodified part 406b. In addition, when the material of the dummy patterns 104 is polysilicon, the modified parts 104a are formed by silicon oxide.

Figure 4C:
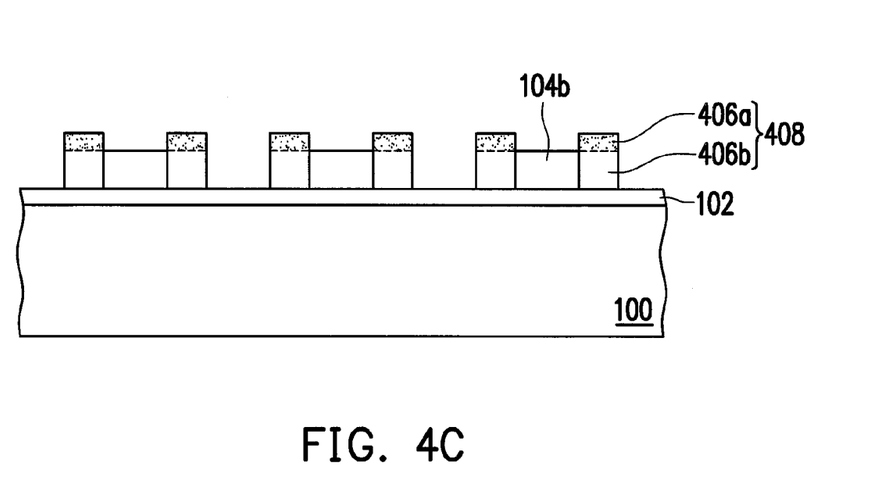

Referring to FIG. 4C, the dielectric layer 404 and a portion of the mask material layer 406 (i.e. the unmodified part 406b) therebelow are removed by using the modified part 406a as a mask, so as to expose the pad layer 102. In an embodiment, the dielectric layer 404 and the modified parts 104a of the dummy patterns 104 have similar etching rate, so that the modified parts 104a can be simultaneously removed during the step of removing the dielectric layer 404 and the portion of the mask material layer 406, and thus, the top surfaces of the unmodified parts 104b are exposed. A mask layer 408 is formed consisting of the remaining unmodified part 406b on the sidewalls of the unmodified parts 104b and the modified part 406a.

Figure 4D:
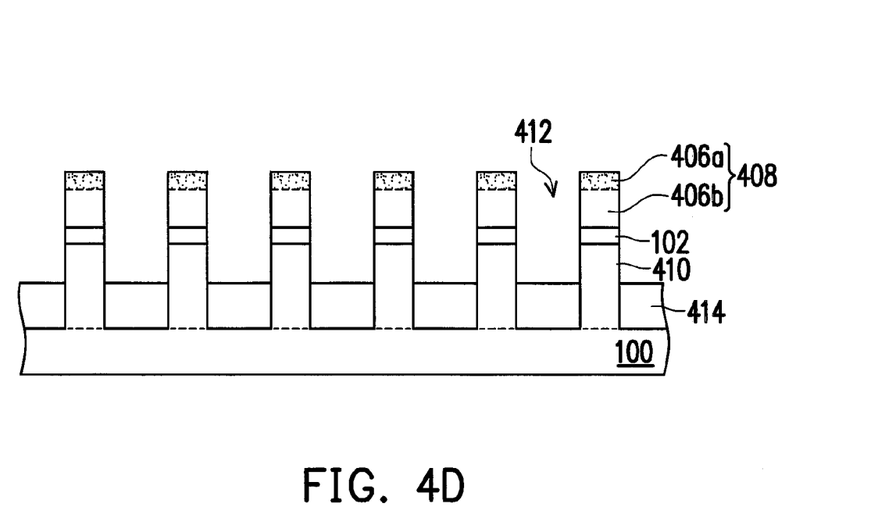

Referring to FIG. 4D, the unmodified parts 104b of the dummy patterns 104 are removed to merely retain the mask layer 408 on the pad layer 102. Thereafter, the exposed pad layer 102 and a portion of the substrate 100 are removed by using the unmodified part 306b as a mask, so as to form a plurality of fin structures 410 and a plurality of trenches 412 arranged alternately in the substrate 100. Afterwards, isolation structures 414 are formed in the trenches 412, and top surfaces thereof are lower than those of the fin structures 410. Then, the mask layer 408 and the pad layer 102 on the fin structures 410 are removed by the described method, and a gate, sources and drains are formed, thereby obtaining the FnFET structure.

Fifth Embodiment

FIGS. 5A to 5D schematically illustrate cross-sectional views of a semiconductor process according to a fifth embodiment of the present invention. The process steps and sequence in FIGS. 5A to 5D are similar to those in FIGS. 2A to 2D. The same reference numbers denote the same components and the details are not iterated herein.

Figure 5A:
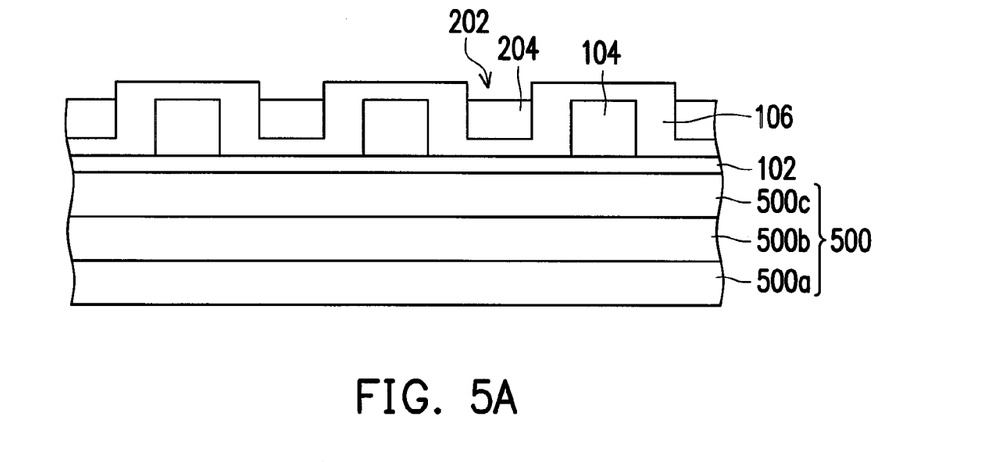
FIGS. 5A to 5D schematically illustrate cross-sectional views of a semiconductor process according to a fifth embodiment of the present invention.

Referring to FIG. 5A, the main difference between the second and fifth embodiments lies in that a SOI substrate 500, in this embodiment, replaces the bulk substrate 100 of FIG. 2A. Specifically, the substrate 500 includes a bottom layer 500a, an insulating layer 500b and a bulk layer 500c as a device layer. The insulating layer 500b is disposed between the bottom layer 500b and the bulk layer 500c for reducing the power consumption and enhancing the device performance. The bottom layer 500a and the bulk layer 500c include the same or different materials. The material of the bottom layer 500b and the bulk layer 500c is selected from Si, Ge-doped Si, C-doped Si, SiGe, Ge and III-V semiconductor such as GaAs, InGaAs, InSb, InAs, GaSb or InP, etc. The insulating layer 500b can be a buried oxide (BOX) layer, and the material thereof is silicon oxide or a suitable insulating material, for example. Thereafter, the pad layer 102, the dummy patterns 104, the mask material layer 106 and the photoresist layer 204 as described in FIG. 2A are sequentially formed on the bulk layer 500c.

Figure 5B:
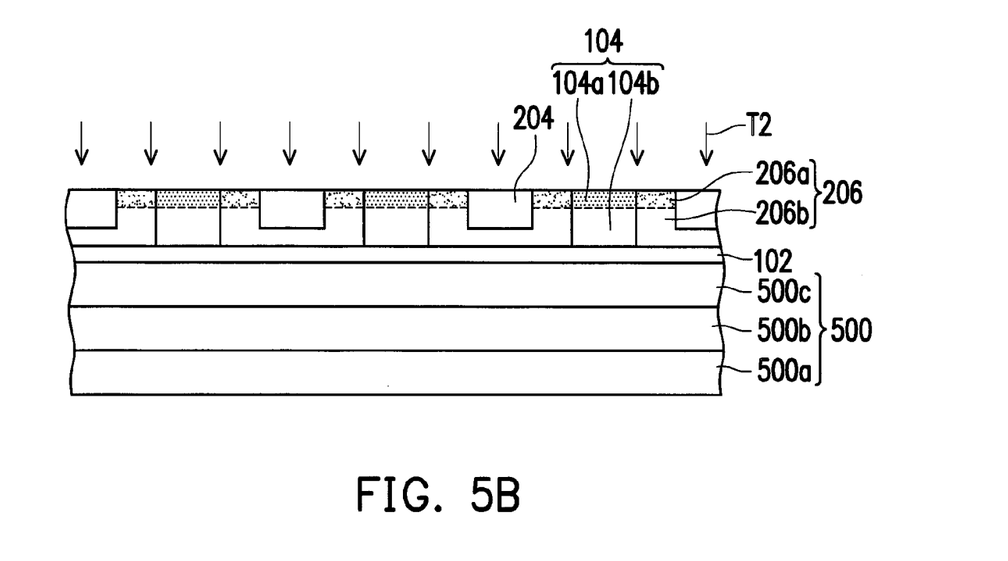

Referring to FIG. 5B, a portion of the mask material layer 106 on the dummy patterns 104 is removed by using the photoresist layer 204 as a mask. Thereafter, a modification treatment T2 is performed to the remaining mask material layer 206, so that the mask material layer 206 has a modified part 206a and an unmodified part 206b.

Figure 5C:
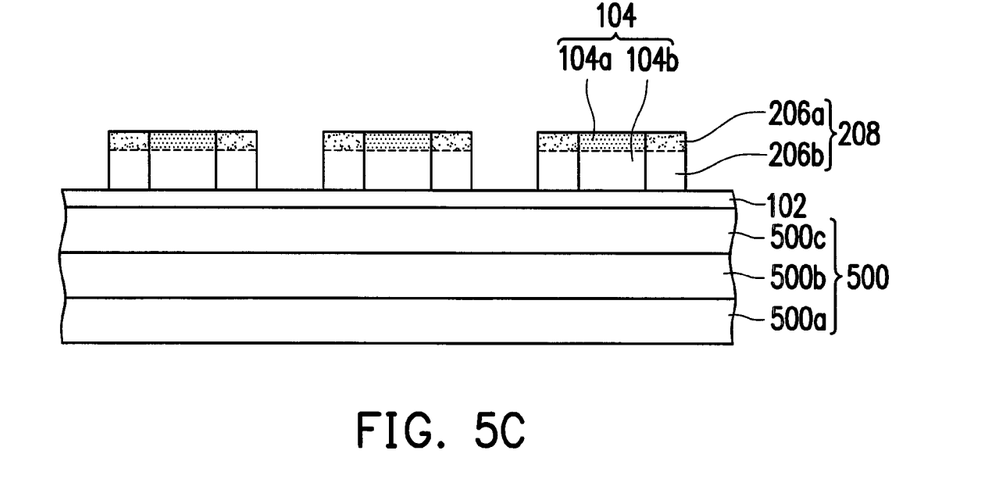

Referring to FIG. 5C, the photoresist layer 204 and a portion of the unmodified part 206b therebelow are removed by using the modified parts 104a and the modified part 206a as a mask, so as to form the mask layer 208 on both sidewalls of the dummy patterns 104.

Figure 5D:
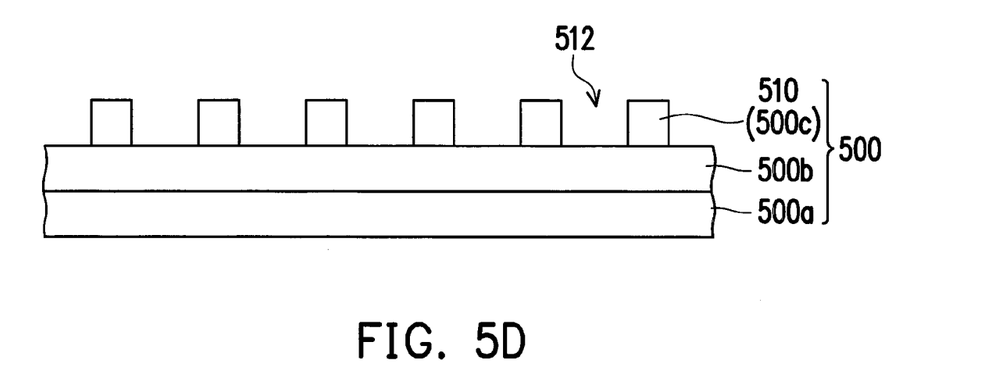

Referring to FIG. 5D, after the dummy patterns 104 are removed, the exposed pad layer 102 and a portion of the bulk layer 500c are removed by using the mask layer 208 as a mask, so as to form a plurality of trenches 512 and expose a portion of the insulating layer 500b. The patterned bulk layer 500c forms a plurality of fin structures 510, and the fin structures 510 and the trenches 512 are arranged alternately. Afterwards, the mask layer 208 and the pad layer 102 are removed to expose the top surfaces of the fin structures 510.

It is noted that in this embodiment, since the SOI substrate 500 is adopted, it is not required to form isolation structures in the trenches 512 after patterning the bulk layer 500c. That is to say, as shown in FIG. 5D, the insulating layer 500b below the fin structures 510 can serve as isolation structures. Thereafter, a gate, sources and drains are formed by the described methods of the said embodiments, so as to complete the fabrication of the FnFET structure.

It is further noted that the third embodiment in which hard mask layers are respectively formed on the dummy patterns and the fifth embodiment in which a SOI substrate is adopted are provided for illustration purposes, and are not construed as limiting the present invention. In other feasible embodiments, hard mask layers can be further formed on the dummy patterns, or a SOI substrate can replace the bulk substrate. In other words, partial replacements or combinations between the said embodiments are not limited by the present invention. The applications and modifications should be apparent to those having ordinary skill in the art in accordance with the said embodiments, and thus, the detailed descriptions are not specifically described herein.

In summary, in the semiconductor process of the embodiments of the invention, a mask layer is formed on the sidewalls of dummy patterns by performing a modification treatment to the surface of a mask material layer, and the upper surface of the mask layer is coplanar with the upper surfaces of the dummy patterns. Therefore, the mask layer has a good pattern profile and the upper portion thereof does not form a rounding top of a spacer. Accordingly, the fin structures defined by the mask layer can have a narrower pattern line width with less variation, and the pattern transfer can be done preciously from the mask layer to the fin structures.

In addition, the semiconductor process of the present invention can be easily integrated with the current FinFET process. The process is simple and the performance of the subsequently formed device can be significantly enhanced.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor process, comprising:
   forming a plurality of dummy patterns on a substrate;
   conformally forming a mask material layer on the substrate to cover the dummy patterns, wherein an etching rate of the mask material layer is different from an etching rate of the dummy patterns;
   removing a portion of the mask material layer, so as to form a mask layer on sidewalls of each dummy pattern, wherein an upper surface of the mask layer is substantially coplanar with upper surfaces of the dummy patterns;
   removing the dummy patterns;
   removing a portion of the substrate by using the mask layer as a mask, so as to form a plurality of fin structures and a plurality of trenches alternately arranged in the substrate; and
   removing the mask layer.

2. The semiconductor process of claim 1, wherein a method of forming the mask layer comprises:
   performing a modification treatment to a surface of the mask material layer substantially parallel to a horizontal plane, so that the mask material layer has a modified part and an unmodified part; and
   removing the modified part.

3. The semiconductor process of claim 2, wherein the modification treatment comprises a vertical ion implantation process.

4. The semiconductor process of claim 3, wherein the vertical ion implantation process implants carbon ions into the modified part.

5. The semiconductor process of claim 1, wherein a method of forming the mask layer comprises:
   forming a photoresist layer on the mask material layer between two adjacent dummy patterns, so as to at least expose a portion of the mask material layer on the dummy patterns;
   removing a portion of the mask material layer by using the photoresist layer as a mask, so as to expose top surfaces of the dummy patterns;
   performing a modification treatment to an exposed surface of the mask material layer by using the photoresist layer as a mask, so that the mask material layer has a modified part and an unmodified part, wherein an etching rate of the modified part is different from an etching rate of the unmodified part; and
   removing the photoresist layer and a portion of the unmodified part therebelow by using the modified part as a mask.

6. The semiconductor process of claim 5, wherein the modification treatment comprises an oxidation treatment.

7. The semiconductor process of claim 6, wherein the oxidation treatment comprises an oxygen plasma process or an oxygen ion implantation process.

8. The semiconductor process of claim 5, further comprising forming a plurality of hard mask layers respectively on the dummy patterns before the step of forming the mask material layer, so that the mask material layer covers the hard mask layers.

9. The semiconductor process of claim 1, wherein a method of forming the mask layer comprises:
   forming a dielectric layer on the mask material layer between two adjacent dummy patterns, wherein a top surface of the dielectric layer is substantially as high as a top surface of the mask material layer on the dummy patterns;
   removing a portion of the mask material layer on the dummy patterns and a portion of the dielectric layer, so as to expose top surfaces of the dummy patterns;
   performing a modification treatment to an exposed surface of the mask material layer by using the remaining dielectric layer as a mask, so that the mask material layer has a modified part and an unmodified part, wherein an etching rate of the modified part is different from an etching rate of the unmodified part; and
   removing the dielectric layer and a portion of the unmodified part therebelow by using the modified part as a mask.

10. The semiconductor process of claim 9, wherein the modification treatment comprises an oxidation treatment.

11. The semiconductor process of claim 10, wherein the oxidation treatment comprises an oxygen plasma process or an oxygen ion implantation process.

12. The semiconductor process of claim 9, further comprising forming a plurality of hard mask layers respectively on the dummy patterns before the step of forming the mask material layer, so that the mask material layer covers the hard mask layers.

13. The semiconductor process of claim 1, wherein the substrate is a bulk substrate.

14. The semiconductor process of claim 13, further comprising forming a plurality of isolation structures in the trenches respectively, wherein top surfaces of the isolation structures are lower than top surfaces of the fin structures.

15. The semiconductor process of the claim 1, wherein the substrate comprises a bottom layer, an insulating layer and a bulk layer, and the insulating layer is disposed between the bottom layer and the bulk layer.

16. The semiconductor process of claim 15, wherein a method of forming the fin structures comprises removing a portion of the bulk layer by using the mask layer as a mask, so as to expose a portion of the insulating layer.

17. The semiconductor process of claim 1, further comprising forming a gate on the substrate to cover the fin structures.

18. The semiconductor process of claim 1, further comprising forming a source and a drain on respective ends of each fin structure.

* * * * *